(12) United States Patent
Kawanaka

(10) Patent No.: US 7,081,653 B2
(45) Date of Patent: Jul. 25, 2006

(54) SEMICONDUCTOR MEMORY DEVICE HAVING MIS-TYPE TRANSISTORS

(75) Inventor: Shigeru Kawanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 10/075,464

(22) Filed: Feb. 15, 2002

(65) Prior Publication Data
US 2003/0111681 A1  Jun. 19, 2003

(30) Foreign Application Priority Data
Dec. 14, 2001  (JP) .............................. 2001-381458

(51) Int. Cl.
*H01L 27/01* (2006.01)
(52) U.S. Cl. ..................... 257/347; 257/213; 257/288
(58) Field of Classification Search ................ 257/347, 257/348, 349, 350, 351, 352, 353, 354
See application file for complete search history.

(56) References Cited

U.S. PATENT DOCUMENTS

| | | | | |
|---|---|---|---|---|
| 4,722,910 A | * | 2/1988 | Yasaitis | 438/297 |
| 5,162,880 A | * | 11/1992 | Hazama et al. | 365/184 |
| 5,494,857 A | * | 2/1996 | Cooperman et al. | 438/437 |
| 5,604,700 A | * | 2/1997 | Parris et al. | |
| 5,736,435 A | * | 4/1998 | Venkatesan et al. | 438/151 |
| 6,534,373 B1 | * | 3/2003 | Yu | 438/372 |

FOREIGN PATENT DOCUMENTS

EP      0 551 214 A2    7/1993

(Continued)

OTHER PUBLICATIONS

Wolf, "Silicon Processing for the VLSI Era, vol. 2—Process Integration," 1990, Lattice Press, p. 12-13.*

(Continued)

*Primary Examiner*—Nathan J. Flynn
*Assistant Examiner*—Kevin Quinto
(74) *Attorney, Agent, or Firm*—Oblon, Spivak, McClelland, Maier & Neustadt, P.C.

(57) ABSTRACT

According to one aspect of the present invention, a semiconductor memory device has: a semiconductor layer formed on an insulating film; and a memory cell array including a matrix arrangement of a plurality of memory cells each made up of first and second transistors connected in series, one side of each memory cell being connected to a bit line and the other side of each memory cell being supplied with a reference potential, and according to another aspect of the present invention, a semiconductor memory device manufacturing method includes: forming an oxide layer and a silicon active layer on a semiconductor substrate; forming an element isolation region for separating said silicon active layer into discrete element-forming regions to be substantially flush with said silicon active layer; forming gate electrode of paired two transistors by depositing a gate electrode material on said silicon active layer and patterning it; injecting predetermined ions into a region for forming a diffusion layer in, using said gate electrodes as an ion injection mask; forming said paired transistors by activating the injected ions through a heat process; and forming a first gate line connected to the gate electrode of one of said paired transistors and a second gate line connected to the gate electrode of the other of said paired transistors.

10 Claims, 10 Drawing Sheets

FOREIGN PATENT DOCUMENTS

| | | |
|---|---|---|
| JP | 62-7149 | 1/1987 |
| JP | 62-7150 | 1/1987 |
| JP | 3-171768 | 7/1991 |
| JP | 5-110037 | 4/1993 |
| JP | 9-135030 | 5/1997 |
| KR | 110488 | 9/1996 |
| WO | WO 95/15562 | 6/1995 |

OTHER PUBLICATIONS

Hideto Hidaka, et al., "A High-Density Dual-Port Memory Cell Operation and Array Architecture for ULSI DRAM's", IEEE Journal of Solid-State Circuits, vol. 27, No. 4, Apr. 1992, pp. 610-617.

* cited by examiner

SEMICONDUCTOR MEMORY DEVICE HAVING MIS-TYPE TRANSISTORS

CROSS REFERENCE TO RELATED APPLICATION

This application is based upon and claims the benefit of priority under 35USC §119 to the prior Japanese Patent Application No. 2001-381458 filed on Dec. 14, 2001; the entire contents of which are incorporated herein by reference.

BACKGROUND OF THE INVENTION

This invention relates to a semiconductor memory device, and more particularly, to a MIS-type semiconductor memory device using a SOI (silicon on insulator) element formed on an insulating film.

Density of integration and resultant increase of the memory capacity are important factors for improving the performance of memory LSI using MIS (Metal-Insulator-Semiconductor) type semiconductor elements. Improvement of density of integration has conventionally relied on reducing the size of elements.

SRAM (Static Random Access Memory) and DRAM (Dynamic Random Access Memory) are well known as memory LSI. In DRAM, one storage cell is made up of a combination of one capacitor for holding an electric charge and one transistor for controlling injection and emission of the electric charge. Therefore, DRAM eliminates the use of transistors in cross connection, which are required in SRAM, thereby can reduce the memory size, and is suitable for enhancing the integration. Actually, therefore, DRAM has moved on toward higher and higher integration.

However, since miniaturization of capacitors was more difficult than miniaturization of transistors, as the integration of LSI progressed, the area occupied by capacitors, which needed a relatively large area, relatively increased, and this have made it difficult to form capacitors ensuring reliable operation. Beside this, because DRAM needs the process of producing capacitors as an additional process, it has complicated the manufacturing process and has caused a longer period of time for the manufacture, higher cost and lower ratio of non-defective products (production yield).

For the purpose of overcoming those problems attendant to the presence of capacitors, various proposals have been presented. A memory cell employing a SOI (Silicon On Insulator) structure in which an element is formed on an insulating film is known as one of such proposals. This memory cell uses a partial depletion type SOI element and is based on the principle of having an electric charge accumulated in or exhaled from the floating body region of the element in response to the stored data to vary the threshold voltage of the element such that, upon reading, data is distinguished by detection of the threshold value.

FIG. 13 shows a basic circuit diagram of a memory cell using such a SOI element. The gate of a partial depletion type transistor Tr is connected to a word line WL, one of the source and the drain to a bit line BL, and the other to Vss.

Behaviors of the memory cell will be explained below. Here is taken an example using an n-channel MOSFET (nMOSFET).

When data is written in the body region in a floating condition, the word line WL as the gate electrode is set in a high potential (HIGH) state, such as Vcc, and the bit line BL in a HIGH state, also such as Vcc. Then, when a channel current flows, impact ionization occurs, and holes are accumulated in the body region. Additionally, since the diffusion layer connected to the bit line and the pn junction located in the body region are reverse-biased, a leak current in the reverse direction is generated, and this results in increasing the potential of the body region and decreasing the threshold voltage of the element. This status is determined as writing of data "1", for example.

On the other hand, when the word line is set in a HIGH state, such as Vcc, and the bit line is set in a low potential (LOW) state, such as −Vcc, for example, the diffusion layer connected to the bit line and the pn junction located in the body region are forward-biased. Therefore, holes in the body region flow toward the bit line, and the hole concentration in the body region decreases. As a result, potential of the body region lowers, and the threshold voltage of the element rises. This status is determined as writing of data "0".

In this manner, it is possible to let the partially depleted transistor change in threshold value in response to the stored data.

This method makes it possible to make up a single memory cell using only one transistor without using a capacitor that has been cumbersome because of the area it occupied, and makes it possible to accomplish higher integration, simplification of the manufacturing process, reduction of the cost, and so forth.

Such configuration, however, invited undesirable flow of a channel current also upon application of −Vcc to a bit line for the purpose of writing data "0", which made it difficult to efficiently draw out holes of the body region, and therefore involved the problem of taking much time for writing data "0" or rendering the writing unstable.

SUMMARY OF THE INVENTION

According to one embodiment of the present invention, there is provided a semiconductor memory device comprising:

a semiconductor layer formed on an insulating film; and a memory cell array including a matrix arrangement of a plurality of memory cells each made up of first and second transistors connected in series, one side of each said memory cell being connected to a bit line and the other side of each said memory cell being supplied with a reference potential.

According to another embodiment of the present invention, there is provided a semiconductor memory device comprising:

a semiconductor layer formed on an insulating film; and a memory cell array including a matrix arrangement of a plurality of memory cells each made up of first and second transistors connected in series, one side of each said memory cell being connected to a bit line and the other side of each said memory cell being supplied with a reference potential, wherein the threshold value is controlled by controlling injection or discharge of an electric charge to or from a body region of one of said transistors of a selected memory cell, thereby to store data.

Also, according to further embodiment of the present invention, there is provided a semiconductor memory device manufacturing method comprising:

forming an oxide layer and a silicon active layer on a semiconductor substrate;

forming an element isolation region for separating said silicon active layer into discrete element-forming regions to be substantially flush with said silicon active layer;

forming gate electrode of paired two transistors by depositing a gate electrode material on said silicon active layer and patterning it;

injecting predetermined ions into a region for forming a diffusion layer in, using said gate electrodes as an ion injection mask;

forming said paired transistors by activating the injected ions through a heat process; and forming a first gate line connected to the gate electrode of one of said paired transistors and a second gate line connected to the gate electrode of the other of said paired transistors.

BRIEF DESCRIPTION OF THE DRAWINGS

In the accompanying drawings.

DETAILED DESCRIPTION OF THE INVENTION

Embodiments of the invention will now be explained in detail with reference to the drawings.

Figure 1:
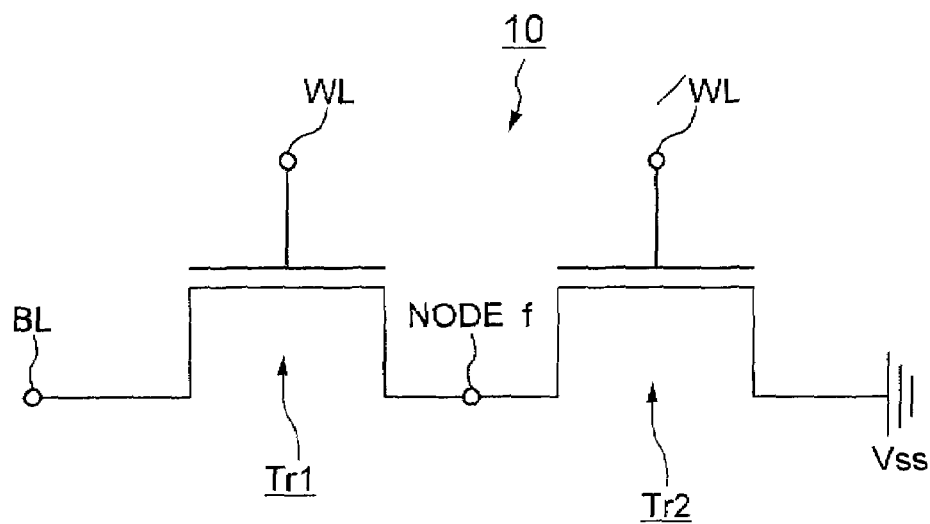
FIG. 1 is a schematic diagram illustrating the basic concept of an embodiment of the memory cell used in a semiconductor memory device according to the invention.

FIG. 1 is a schematic diagram that shows the basis concept of a memory cell 10 used in an embodiment of the semiconductor memory device according to the invention.

Referring to FIG. 1, the memory cell is made up by serially connecting a transistor Tr1 and a transistor Tr2 that are two n-channel partially-depeleted MOSFETs (nMOS) formed in a semiconductor layer on an insulating film (SOI), connecting one of diffusion layers of the transistor Tr1 to a bit line BL, connecting the other diffusion layer of the transistor Tr1 to one of diffusion layers of the transistor Tr2, and connecting the other diffusion layer of the transistor Tr2 to the power source Vss illustrated as a ground connection.

The connection node between the other side of the transistor Tr1 and one side of the transistor Tr2 is floating, and let this node called as node f.

Connected to the gate of the transistor Tr1 is a first word line WL that is a selection signal line of the memory cell, and connected to the gate of the transistor Tr2 is a second word line /WL that is a selection signal line of the inverse logic from the first word line.

Figure 2:
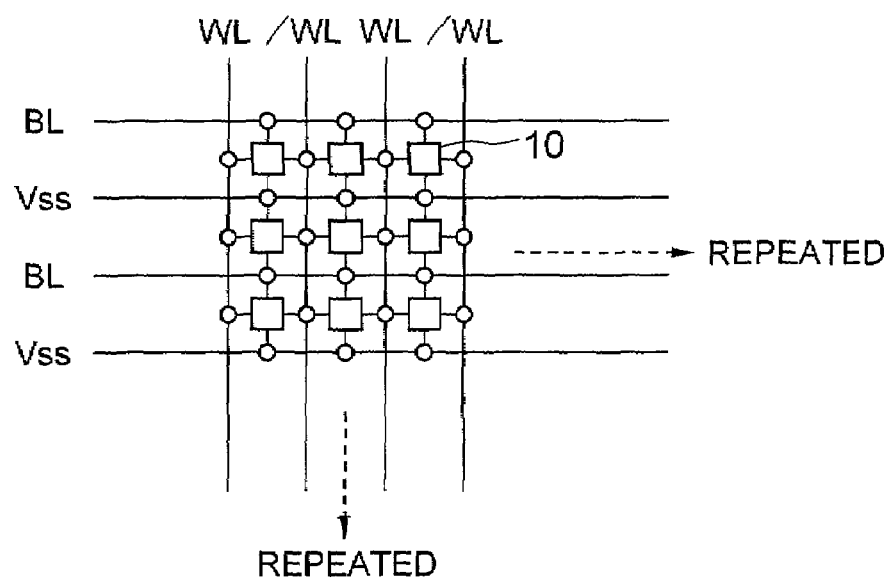
FIG. 2 is a rough connection diagram that shows an aspect of memory cell array made by using a plurality of memory cells shown in FIG. 1.
Figure 3:
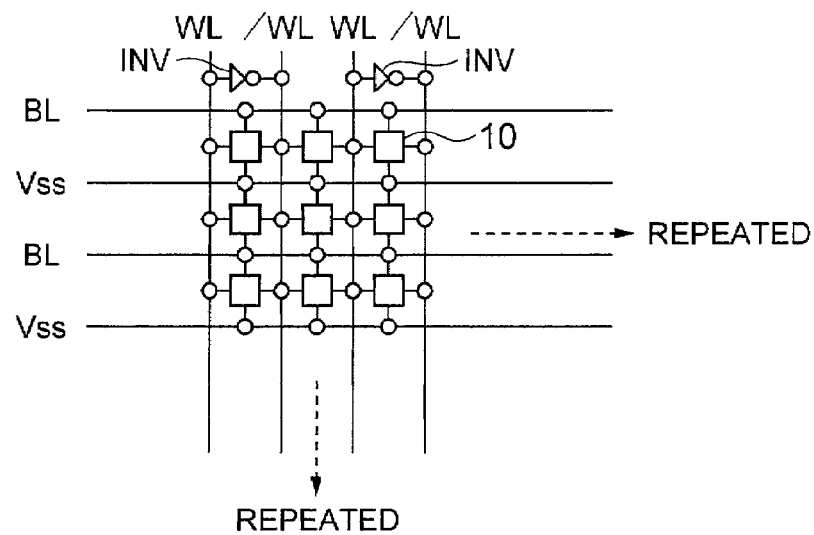
FIG. 3 is a rough connection diagram that shows an aspect of memory cell array made by using a plurality of memory cells shown in FIG. 1.

An aspect of memory cell array made by using a plurality of memory cells 10 shown in FIG. 1 is shown in rough connection diagrams of FIGS. 2 and 3.

In FIG. 2, memory cells 10 shown in FIG. 1 are arranged in a matrix, and word lines WL and word lines /WL are alternately arranged to extend vertically and connected to gate electrodes of respective memory cells 10, whereas bit lines BL and grounded source potentials Vss are alternately arranged to extend horizontally between memory cells 10 and connected to terminals of the memory cells. In this arrangement, memory cells 10 belonging to adjacent columns have a positional relation making a specular relation one another. By enabling individual word lines WL and /WL to be selected absolutely independently, each column of memory cells can be selected easily.

FIG. 3 is the same as FIG. 2 in arrangement, etc. of the memory cells 10; however, a word line WL and a word line /WL make a pair, and a complementary relation is established by supplying a word line /WL with a signal level made by inverting the signal level of the counterpart word line WL by an inverter INV.

Behaviors of the memory cell using the partial depletion type SOI will be next explained below in detail. Here is shown an embodiment of operations in case a singe memory cell 10 is made by using two nMOSs as shown in FIG. 1, and it is explained as the low potential (LOW) level of bit lines and word lines being Vss, for example, and the high potential (HIGH) level being Vcc, for example.

In case the memory cell is not selected, the first word line becomes the LOW potential; the transistor Tr1 becomes OFF; the second word line becomes the HIGH potential; and the transistor Tr2 is ON. Therefore, the potential Vss appears at the node f common to the transistor Tr1 and the transistor Tr2.

Figure 4:
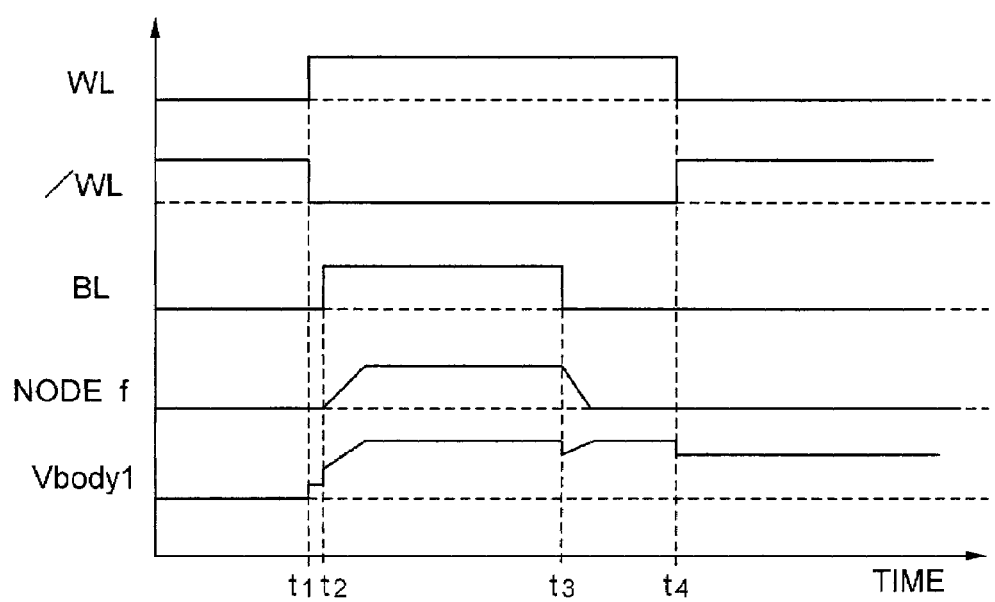
FIG. 4 is a timing chart that shows operations upon writing data "1" in a selected memory cell.

FIG. 4 is a timing chart that shows operations upon writing data "1" in a selected memory cell 10. At time t1, the first word line WL is changed from Vss to Vcc, and the second word line /WL is simultaneously changed from Vcc to Vss. As a result, the transistor Tr1 becomes ON and the transistor Tr2 becomes OFF. At that time, capacitive coupling between the word line and the body region of the transistor Tr1 raises the body potential Vbody1 of the transistor Tr1.

At time t2 slightly later than time t1, the bit lien BL is changed from Vss to Vcc. At that time, capacitive coupling of the pn junction between the diffusion layer in connection with the bit line and the body region raises the body potential of the transistor Tr1. In this case, it is a normal technique to pre-charge the bit line BL to an arbitrary potential. Also in this embodiment, this technique is applicable. This pre-charge potential is not limited, and any desired potential may be employed provided it does not adversely affects the operations. Following to the potential change of the bit line BL, a channel current flows in the transistor Tr1. In response to the channel current, impact ionization occurs, holes flow into the body region, and the body potential gradually rises. At that time, the diffusion region connected to the bit line BL and the pn junction located in the body region are reverse biased, and a resultant flow of a leak current in the reverse direction causes more holes to flow into the body region. As a result, potential of the node f asymptotically approaches and reaches Vcc, and that Vcc is maintained thereafter. Also when the bit line BL changes before a change of the potential of the first and second word lines, a similar channel current flows in the transistor Tr1, similar impact ionization occurs, and the body potential of the transistor Tr1 rises.

At time t3, the bit line is changed from Vcc to, for example, Vss. At that time, capacitive coupling of the pn junction lowers the body potential for a moment, but since the channel current flows in the transistor Tr1 and impact ionization occurs responsively, holes flow into the body region, and the body potential of the transistor Tr1 is still maintained. The potential of the node f asymptotically approaches Vss.

After that, by changing the first word line WL from Vcc to, for example, Vss, and changing the second word line /WL from Vcc to Vcc at time t4, data write operations are completed. At that time, the above-mentioned capacitive coupling again lowers the body potential slightly from Vcc.

Changes in potential of the first and second word lines may precede potential changes of the bit line BL. In this case, however, impact ionization does not occur. Therefore, the bit line is preferably changed earlier, as explained above.

Figure 5:
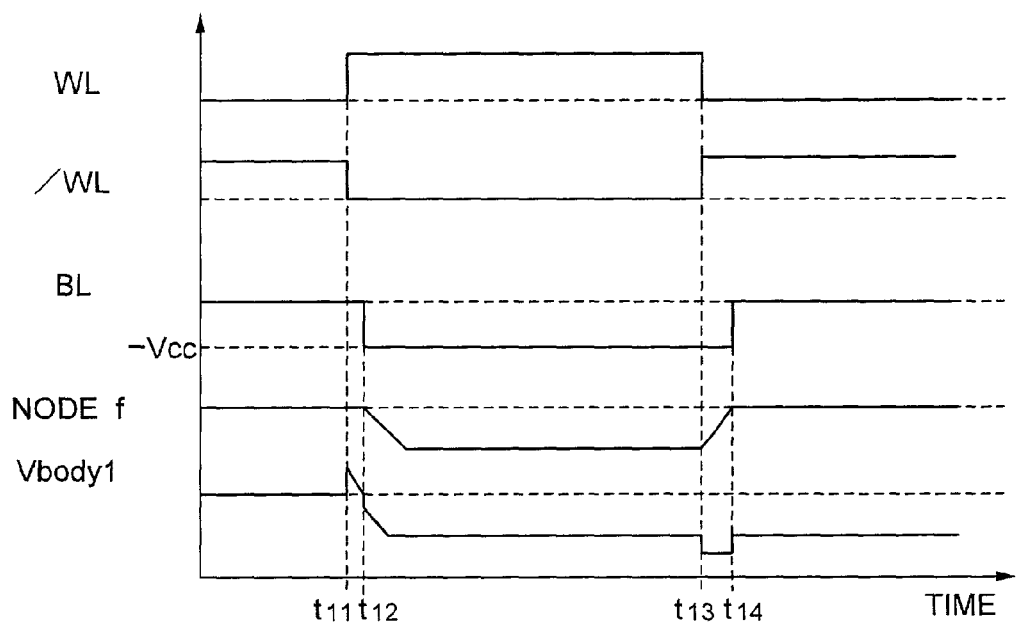
FIG. 5 is a timing chart that shows operations upon writing data "0" in a selected memory cell.

FIG. 5 is a timing chart that shows operation timings upon writing data "0" in a selected memory cell 10.

First, in the same manner as the process of writing data "1", at time t11, the first word line WL is changed from Vss to Vcc, and the second word line /WL is simultaneously changed from Vcc to Vss. As a result, the transistor Tr1 becomes ON and the transistor Tr2 becomes OFF. At that time, capacitive coupling of the first word line and the body region of the transistor Tr1 raises the body potential Vbody1 of the transistor Tr1.

In order to realize a potential corresponding to the LOW potential of the bit line, holes in the body region of the transistor Tr1 must be drawn sufficiently. Therefore, at time t12, the bit line BL is changed from Vss to the pre-charge potential −Vcc. As a result, capacitive coupling of the diffusion layer connected to the bit line and the pn junction located in the body region, lowers the body potential of the transistor Tr1. The pre-charge potential may be any desired potential, and also in this embodiment, a different potential may be used.

Following the potential change of the bit line, the body region of the transistor Tr1 and the pn junction between the diffusion layer in connection with the bit line BL and the node f are biased in the forward direction. Therefore, holes in the body region are exhaled, and the body potential Vbody1 of the transistor Tr1 further lowers. Simultaneously, potential f the node f asymptotically approaches −Vcc. When the transistor Tr2 is OFF the node f is floating, almost no channel current flows in the transistor Tr1 accordingly, holes in he body region are effectively drawn out, and the LOW potential can be written stably.

After that, at time t13, once the word line WL is changed to Vss and the word line /WL to Vcc, the body potential Vbody1 of the transistor Tr1 lowers. Then at t14 immediately thereafter, by changing the bit line from −Vcc to, for example, Vss, data write operations are completed.

Here again, the body potential Vbody1 rises due to the capacitive coupling explained above.

As explained with reference to FIG. 4, potential change of the bit line BL may precede to potential changes of the word line WL and the word line /WL.

Through the above-explained control, once the voltage of the bit line is set to, for example, −1V, the pn junction with the body region is biased forwardly, so the potential of the body can be instantaneously changed to about −0.5V. Thus the margin for writing data "0" is improved.

In the above explanation of write operations, the example has been taken, in which complementary potentials are given in synchronism to the first word line and the second word line; however, potential changes of the respective word lines may be controlled asynchronously.

Next explained are data read-out operations. For reading out data, a difference between current values based on a difference between element threshold voltages of the transistor Tr1 due to stored data is detected by using, for example, a current-sensing type sense-amplifier.

Figure 6:
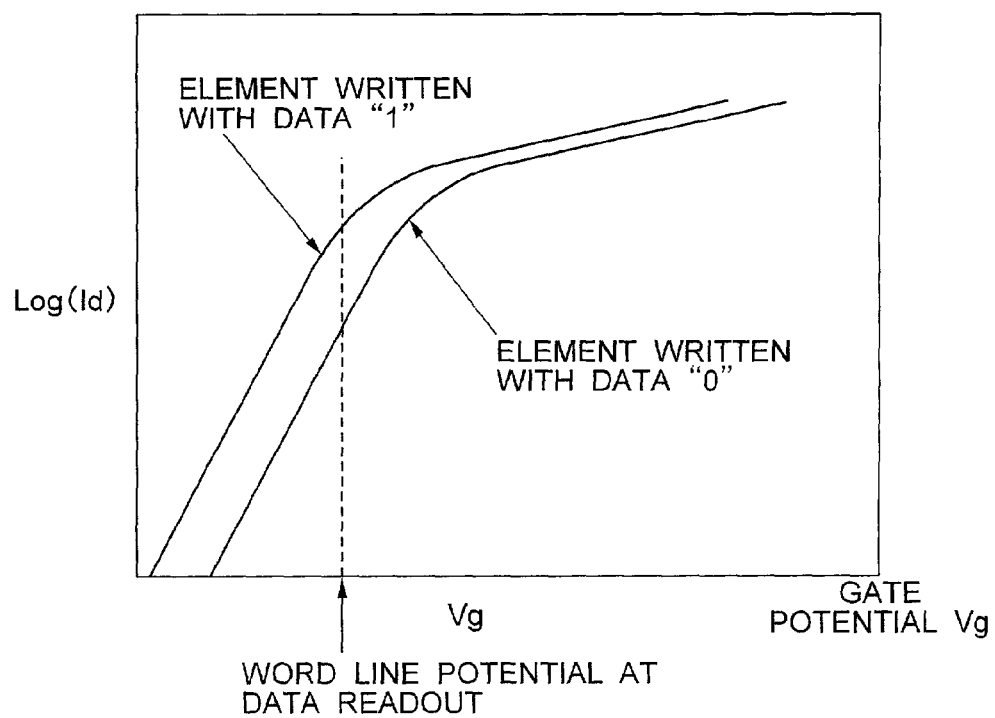
FIG. 6 is a graph that shows how the drain current changes with the content of stored data when data is read out.

FIG. 6 is a graph that shows how the drain current changes with the content of stored data when the data is read out. The gate voltage Vg is taken on the abscissa, and the logarithm of the drain current is taken on the ordinate. As apparent from the graph, the gate voltage necessary for a certain drain current is higher in a transistor Tr1 written with data "0" than in a transistor Tr1 written with data "1". Therefore, the threshold value of a transistor Tr1 with data "1" lowers whereas the threshold voltage of a transistor Tr1 with "0" rises. As a result, when data is read out by using a predetermined word line potential shown by the broken line, the drain current of the transistor Tr1 with data "1" exhibits a high value than the drain current of the transistor Tr1 with data "0". Thus by detecting the difference between these current values, data "1" and data "0" can be judged.

More specifically, a potential corresponding to one half the normal source potential, such as Vcc/2, is used as the gate potential, that is, the word line potential, for judgment.

Figure 7:
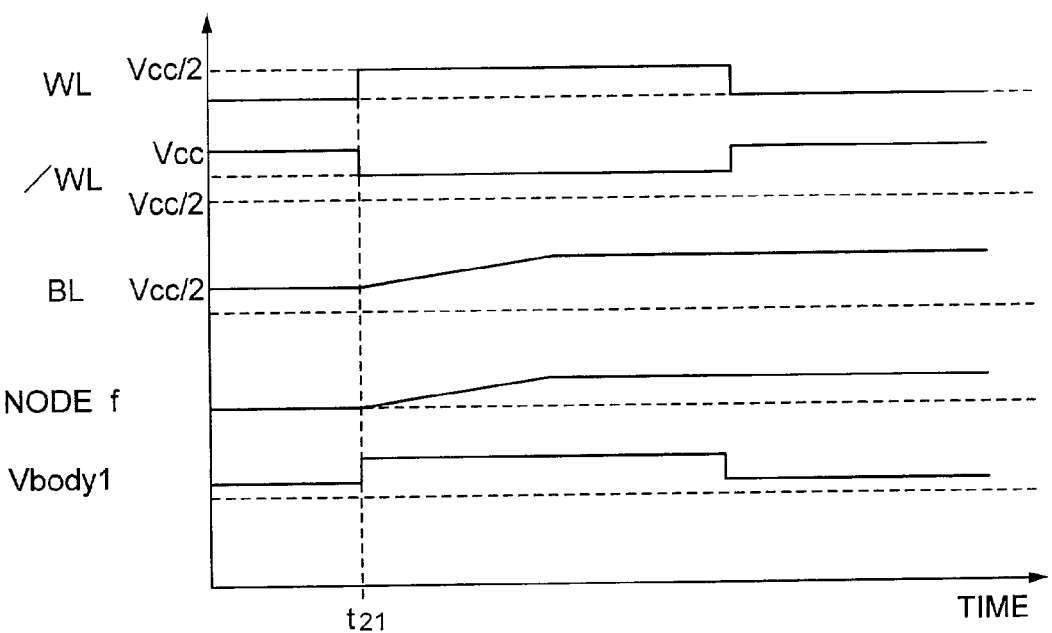
FIG. 7 is a timing chart that shows waveforms upon read-out operations when data "1" is written.

FIG. 7 is a timing chart that shows read-out operation waveforms in case of data "1" being written in the transistor Tr1.

Assume here that the bit line is pre-charged to Vcc/2 in the non-selection period, and a memory cell selected at time t21 where read-out operation is started. At that time, by detecting that the bit line potential BL rises due to an increase of the current flowing into the bit line in response to the rise of the body potential Vbody1 of the transistor Tr1, data can be judged as being "1".

Figure 8:
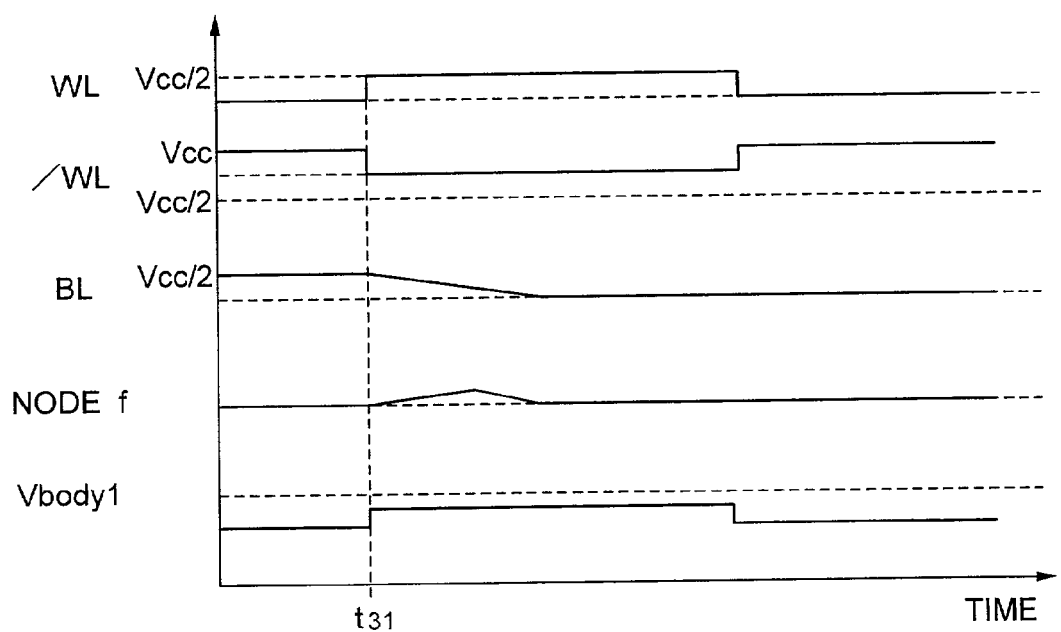
FIG. 8 is a timing chart that shows waveforms upon read-out operations when data "0" is written.

FIG. 8 is a timing chart that shows read-operation waveforms in case of data "0" being written in the transistor Tr1. Similarly to the case of FIG. 7, the bit line is pre-charged to Vcc/2, and the word lines WL and /WL are set in Vcc/2" at the read-out start time t31. However, since the body potential Vbody1 of the transistor Tr1 is currently low, Vbody1 maintains the minus value even after time t31. Therefore, the current flowing into the bit line is smaller than that of FIG. 7, and the bit line potential BL does not change. By detecting it, the data can be judged to be "0".

According to the embodiment, each memory cell is made by serially connecting two transistors, thereby to bring out the advantage of enabling higher integration by eliminating capacitors and to enable stable write of data.

The foregoing embodiment has been explained by way of the example using two nMOS; however, the same object can be accomplished by employing two p-channel MOS transistors (pMOS) as well. Note here, however, that nMOS is more advantageous for miniaturization if the write condition is the same because the write margin of data "1" in nMOS is larger than that in PMOS.

It is also possible to employ a CMOS configuration in which two transistors are opposite in conduction type from each other. This configuration will be explained later.

Further, while the same configuration is used regarding the transistor Tr1 and the transistor Tr2, if the bit line and Vss are operated oppositely and the timing of their signals is controlled by the second word line, then it is possible to hold two data with two elements by writing a datum in the body region of the transistor Tr1 and simultaneously writing another datum in the transistor Tr2.

FIGS. 9A through 9D are cross-sectional views of such an element under different manufacturing steps, that show an embodiment of the manufacturing method of the semiconductor memory device shown in FIG. 1.

First made is a SOI structure having a SOI active layer 13 formed on a semiconductor substrate 11 via a buried oxide (BOX) film 12 such as a silicon oxide film by using an appropriate method, such as SIMOX (separation by implantation of oxygen) technique that obtains an oxide layer and a silicon layer thereon by ion implantation of oxygen ions into a silicon semiconductor substrate and subsequent annealing, or bonding technique that bonds a silicon plate having an oxide film at the bottom to a surface of a silicon semiconductor substrate. The SOI active layer is thereafter thinned to a desired thickness about 150 nm, for example, by thermal oxidation and etching by $NH_4F$, for example.

Figure 9A:
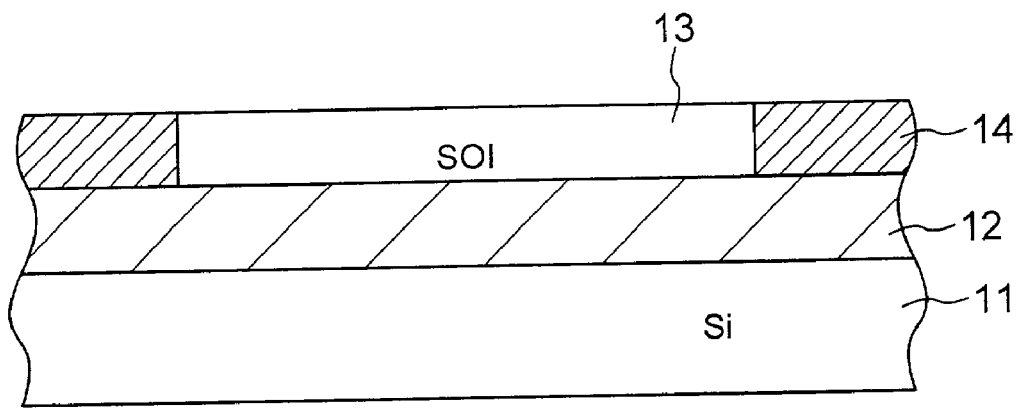
FIGS. 9A through 9D are cross-sectional views of different steps of an embodiment of the manufacturing method according to the invention for manufacturing the semiconductor memory device shown in FIG. 1.

In the next step, as shown in FIG. 9A, for the purpose of electrically separating the SOI active layer 13 into discrete element-forming regions, element isolation regions 14 are formed by, for example, STI (shallow trench isolation) technique that buries shallow trenches with an insulating film.

After that, for the purpose of adjusting the threshold voltage of the elements, impurities are introduced into the SOI active layer 13 in the element-forming regions by the dose of $1.5 \times 10^{-12}$ $cm^{-2}$ by, for example, ion implantation.

Figure 9B:
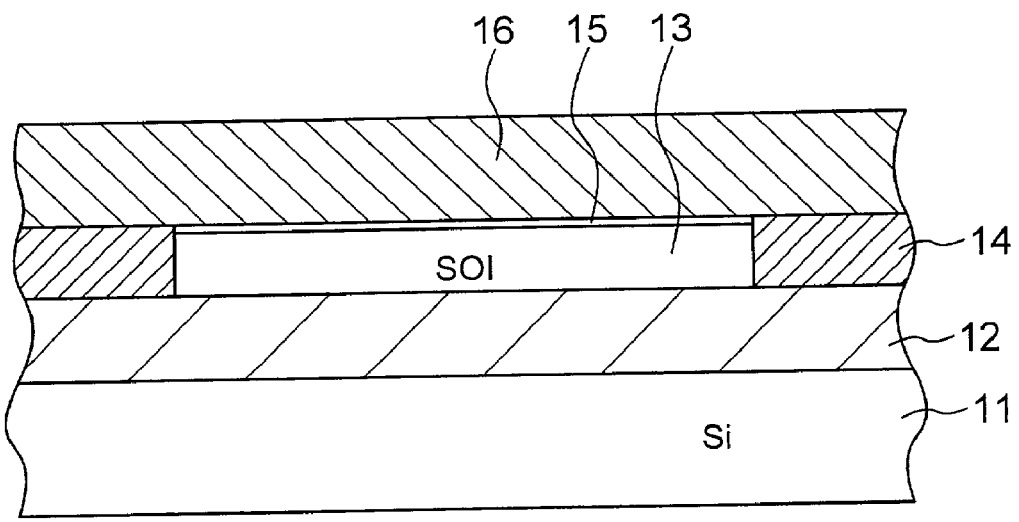

Subsequently, as shown in FIG. 9B, an insulating film 15, which will become a gate insulating film, is formed on the SOI active layer 13 by thermal oxidation, for example. Further stacked thereon is polycrystalline silicon 16 of the thickness of 200 nm by CVD (chemical vapor deposition).

Figure 9C:
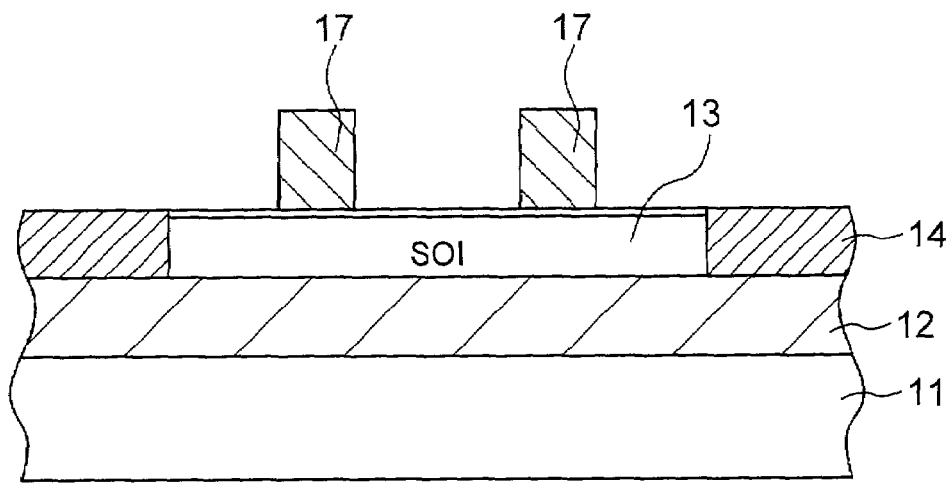

Next as shown in FIG. 9C, using a mask of a resist, for example, the polycrystalline silicon 16 is patterned by selectively removing it from above the source and drain regions by etching, such as reactive ion etching (RIE), thereby to obtain gate electrodes 17.

Using these gate electrodes 17 as a mask against introduction of ions, impurities are introduced into regions for forming diffusion layers in by ion implantation, for example. After that, the impurities introduced by ion implantation are activated in a heat process using annealing such as RTA (rapid thermal annealing).

Figure 9D:
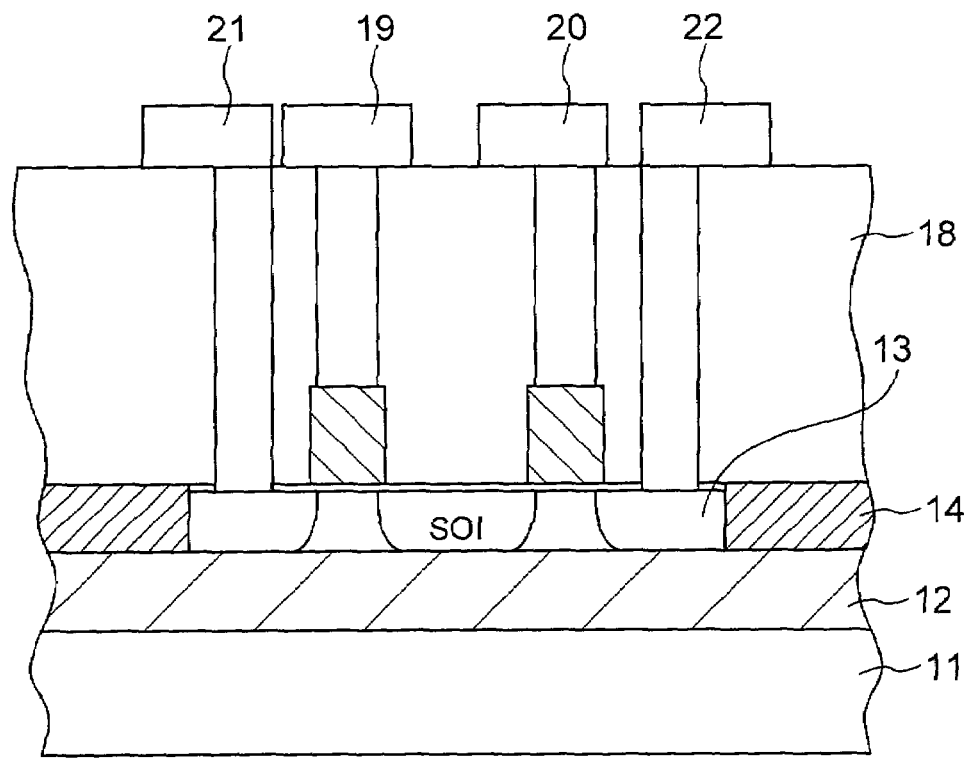

After that, as shown in FIG. 9D, a layer insulating film 18 is stacked; contact holes are formed at given positions; an electrode wiring material like aluminum is formed to bury the contact holes and lie on the layer insulating film 18; and it is patterned to form the first word line (WL) electrode wiring 19, second word line (/WL) electrode wiring 20, bit line electrode wiring 21 and Vss electrode wiring 22, thereby to complete the desired partially-depleted SOI semiconductor device. The wirings may be multi-layered according to the specification required.

Figure 10:
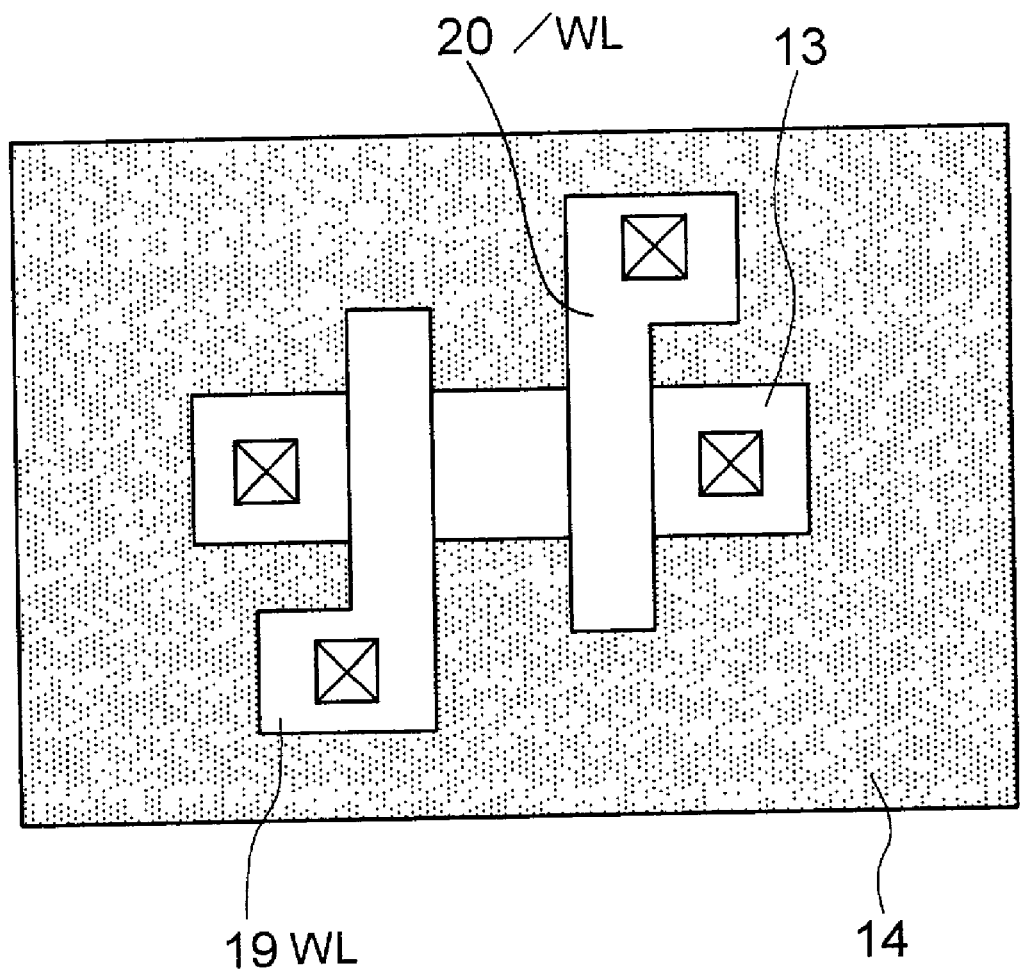
FIG. 10 is a plan view of an element made by the steps of FIGS. 9A through 9D.

FIG. 10 is a plan view of an element made through those steps, in which the same components as those shown in FIG. 9D are labeled with common reference numerals.

Figure 11A:
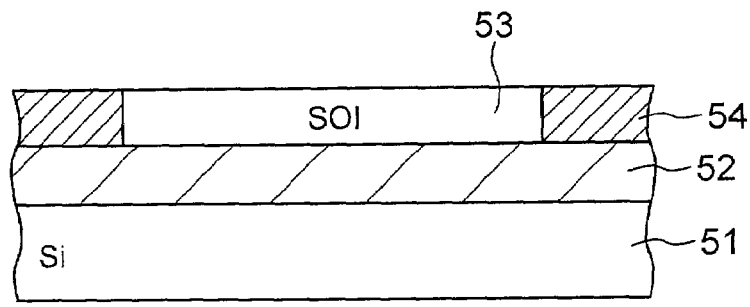
FIGS. 11A through 11F are cross-sectional views of an element under different steps for explaining another embodiment of the manufacturing method of a semiconductor memory device according to the invention.

FIGS. 11A thorough 11E are cross-sectional views of different steps of a further embodiment of the semiconductor memory device manufacturing method according to the invention, and they show an example using a CMOS type memory cell 50.

First made is a SOI structure having a SOI active layer 53 formed on a semiconductor substrate 51 via a buried oxide (BOX) film 52 such as a silicon oxide film by using an appropriate method, such as SIMOX (separation by implantation of oxygen) technique or bonding technique. The SOI active layer 53 is thereafter thinned to a desired thickness about 150 nm, for example, by thermal oxidation and etching by $NH_4F$, for example.

In the next step, as shown in FIG. 11A, for the purpose of electrically separating the SOI active layer 53 into discrete element-forming regions, trench-shaped element isolation regions 54 are formed by, for example STI (shallow trench isolation) technique.

Figure 11B:
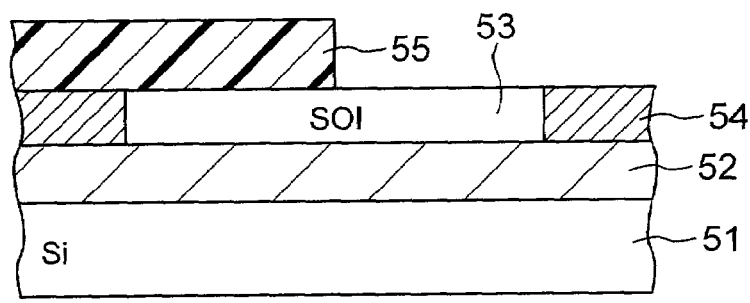

Next as shown in FIG. 11B, for the purpose of adjusting the threshold voltage of the elements, impurities are introduced into the SOI active layer 53 in the element-forming regions. In this embodiment using the CMOS structure, a resist 55 is selectively formed to mask the remainder regions other than the element-forming regions against ions to be introduced. FIG. 11B shows the configuration as introducing impurities into regions for forming pMOS in. As the impurities, boron ions are introduced by the dose of, for example, $1.5 \times 10^{13}$ $cm^{-2}$. A similar step of injecting ions is conducted for the regions for forming nMOS in as well, and phosphorus ions are introduced as impurities by the dose of $1.5 \times 10^{13}$ $cm^{-2}$.

Figure 11C:
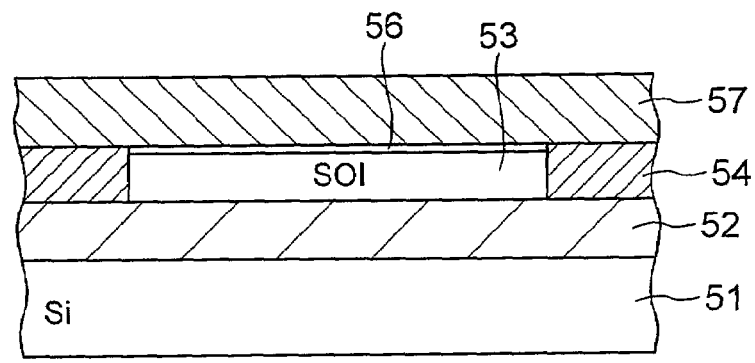

After that, as shown in FIG. 11C, a gate insulating film 56 is formed on the SOI active layer 53 by, for example, thermal oxidation. Further stacked thereon is polycrystalline silicon 57 of the thickness of 200 nm by CVD (chemical vapor deposition).

Figure 11D:
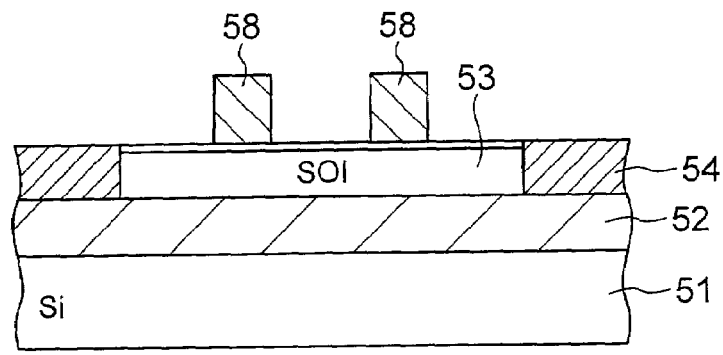

Next as shown in FIG. 11D, using a mask of a resist, for example, the polycrystalline silicon 57 is patterned by selectively removing it from above the source and drain regions by, for example, reactive ion etching (RIE), thereby to obtain gate electrodes 58.

Figure 11E:
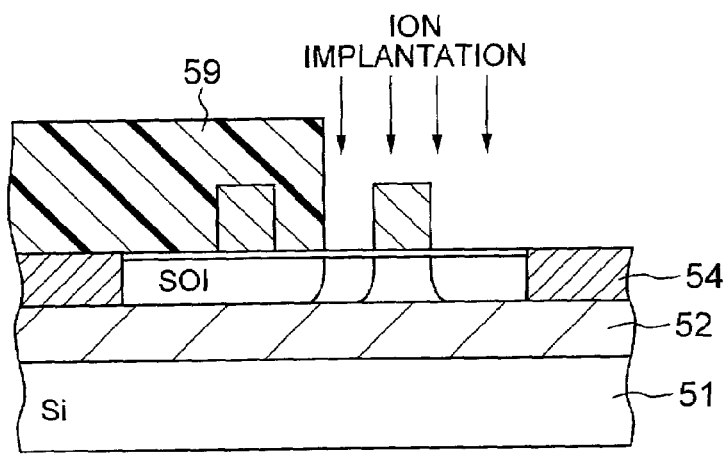

Using these gate electrodes 58 as a mask against introduction of ions, impurities are introduced into regions for forming diffusion layers in by ion implantation, for example. In this case, since ions introduced are different between PMOS and nMOS, upon forming PMOS diffusion layers shown in FIG. 11E, the nMOS regions are masked by a resist 59, and boon ions, for example, are injected by the dose of $3 \times 10^{15}$ $cm^{-2}$. Similarly, upon forming nMOS diffusion layers, pMOS regions are masked by a resist, and phosphorus ions, for example, are injected by the dose of $3 \times 10^{15}$ $cm^{-2}$. After that, the impurities introduced by ion implantation are activated in a heat process using annealing such as RTA (rapid thermal annealing).

Figure 11F:
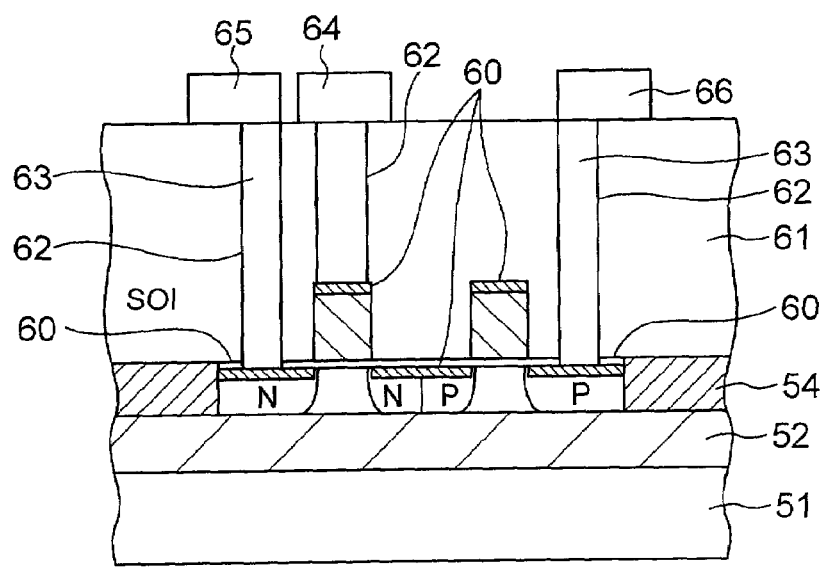

Thereafter, as shown in FIG. 11F, a silicide 60 such as $CoSi_2$ is formed on the source regions, drain regions and gate electrode regions through a salicide step for self-aligned deposition.

Subsequently, a layer insulating film 61 is stacked; contact holes 62 are formed at given positions; and an electrode wiring material 63 like aluminum is deposited by vapor deposition to bury the contact holes 62 and lie on the layer insulating film 60. Then the electrode wiring material on the layer insulating film 60 is patterned to form the fist word line (WL) electrode wiring 64, second word line (/WL) electrode wiring (not shown), electrode wiring 65 for the bit line BL, and Vss electrode wiring 66, thereby to complete the desired partially-depleted SOI semiconductor device. In this semiconductor device, nMOS diffusion layers are connected to bit lines, and pMOS diffusion layers are connected to Vss source lines.

Figure 12:
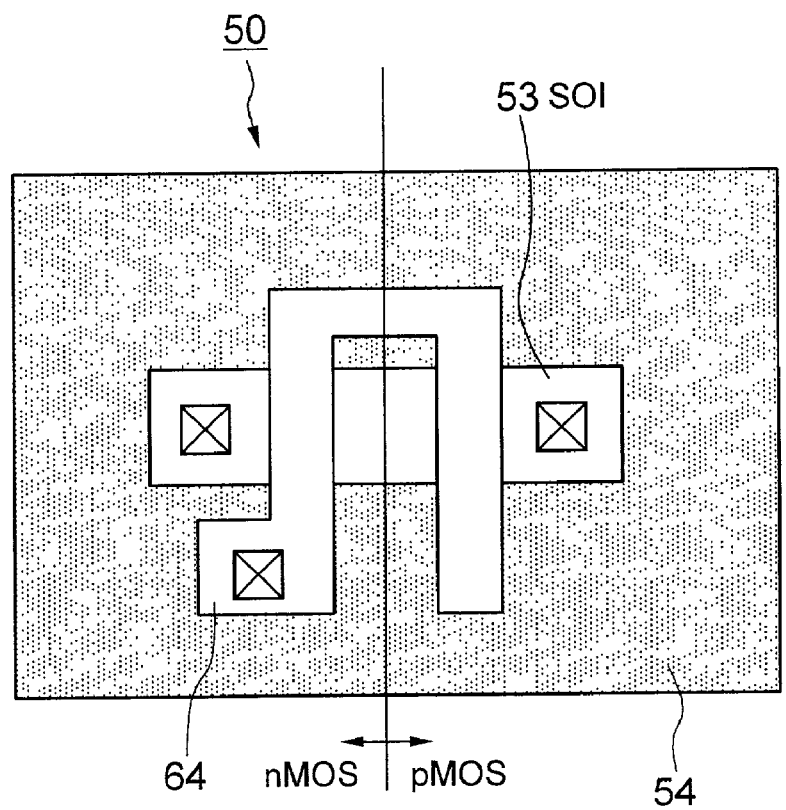
FIG. 12 is a plan view of the element made by the steps of FIGS. 11A through 11D.
Figure 13:
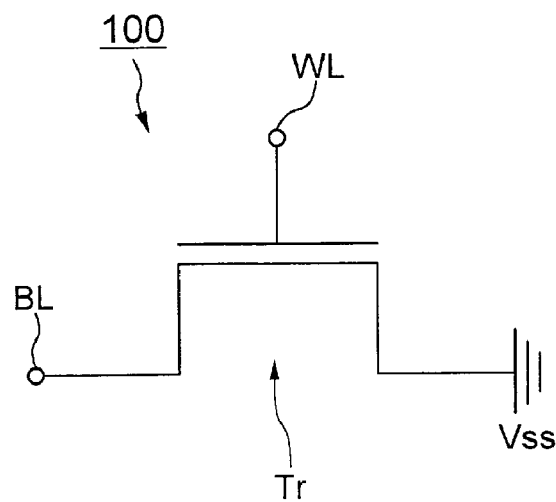
FIG. 13 is a circuit diagram that shows the basic configuration of a memory cell using a conventional SOI element.

FIG. 12 shows a plan view of a memory cell 50 formed through those steps. This is a CMOS memory cell, so the same gate electrode 64 can be commonly shared by nMOS and PMOS without the need of electrically separating the second word line from the first word line.

According to these embodiments, a DRAM element made up solely of MIS elements and eliminating capacitors can be manufactured easily.

The invention is not limited in process of forming elements and in parameter of the device to those shown in the embodiments, but can be brought into practice in appropriately modified forms. For example, although the embodiments have been explained as using single layered wirings, they can be modified to multi-layered wirings according to the specification required. In this case, for making one or more upper layers, the steps of forming the layer insulating film, forming contact holes, vapor deposition of the electrode material and patterning thereof will be repeated.

Furthermore, although the embodiments have been explained by way of nMOSFET or CMOSFET using the SOI substrate, the invention is not limited to it, but can be applied to pMOSFET or other types of substrate such as SOS (silicon on sapphire), and so forth.

Also in the other respects, the invention can be modified in various forms within the concept and scope of the invention.

What is claimed is:

1. A semiconductor memory device comprising:
   a semiconductor layer formed on an insulating film;
   a memory cell array including a matrix arrangement of a plurality of memory cells each made up of first and second transistors connected in series, one side of each said memory cell being connected to a bit line and the other side of each said memory cell being supplied with a reference potential;
   wherein said transistors are MIS-type partially depleted transistors, and;
   wherein said first and second transistors have the same conduction type, and wherein a first word line is connected to the gate of said first transistor, and a second word line of the inverse logic paired with said first word line is connected to the gate of said second transistor.

2. A semiconductor memory device according to claim 1, wherein said word line and said inverse logic word line are controlled to synchronously change in state.

3. A semiconductor memory device according to claim 1, wherein one of said first word line and said second word line change in state with a predetermined delay time after the other changes in state.

4. A semiconductor memory device according to claim 1, wherein an inverter is provided between said first word line and said second word line to invert the signal level.

5. A semiconductor memory device according to claim 1, wherein said transistors having the same conduction type are n-channel type transistors.

6. A semiconductor memory device according to claim 1, wherein said insulating film and said semiconductor layer are formed on a semiconductor substrate.

7. A semiconductor memory device according to claim 1, wherein said insulating film and said semiconductor layer are semiconductor layers on a semiconductor substrate.

8. A semiconductor memory device according to claim 1, wherein each said memory cell made up of said first and second transistors is formed in a region surrounded by an element isolation region.

9. A semiconductor memory device according to claim 8, wherein said element isolation region is a trench-type element isolation film.

10. A semiconductor memory device comprising:
    a semiconductor layer formed on an insulating film;
    a memory cell array including a matrix arrangement of a plurality of memory cells each made up of first and second transistors body regions thereof being connected in series, one side of each said memory cell being connected to a bit line and the other side of each said memory cell being supplied with a reference potential,
    wherein a threshold value of one of said transistors is controlled by controlling injection or discharge of an electric charge to or from a body region of one of said transistors of a selected memory cell, thereby to store data;
    wherein said transistors are MIS-type partially depleted transistors, and;
    wherein injection of the electric charge into the body region of said partially-depleted transistor is affected by impact ions generated by a flow of a channel current.

* * * * *